(12) United States Patent
Guilani

(10) Patent No.: US 12,358,757 B2
(45) Date of Patent: Jul. 15, 2025

(54) WEAR DETECTION FOR ELEVATOR SYSTEM BELT

(71) Applicant: Otis Elevator Company, Farmington, CT (US)

(72) Inventor: Brad Guilani, Woodstock Valley, CT (US)

(73) Assignee: OTIS ELEVATOR COMPANY, Farmington, CT (US)

(*) Notice: Subject to any disclaimer, the term of this patent is extended or adjusted under 35 U.S.C. 154(b) by 0 days.

(21) Appl. No.: 17/847,864

(22) Filed: Jun. 23, 2022

(65) Prior Publication Data

US 2022/0315384 A1 Oct. 6, 2022

Related U.S. Application Data

(62) Division of application No. 16/211,620, filed on Dec. 6, 2018, now Pat. No. 11,396,441.

(Continued)

(51) Int. Cl.
*B66B 7/06* (2006.01)
*B66B 5/00* (2006.01)
*B66B 7/12* (2006.01)
*C23C 18/31* (2006.01)
*D07B 1/14* (2006.01)
*G01N 27/20* (2006.01)

(Continued)

(52) U.S. Cl.
CPC ............ *B66B 7/062* (2013.01); *B66B 5/0031* (2013.01); *B66B 7/1223* (2013.01); *C23C 18/31* (2013.01); *D07B 1/145* (2013.01); *G01N 27/20* (2013.01); *G01R 31/08* (2013.01); *D07B 1/22* (2013.01); *D07B 2201/2087* (2013.01); *D07B 2501/2007* (2013.01)

(58) Field of Classification Search
None
See application file for complete search history.

(56) References Cited

U.S. PATENT DOCUMENTS 5,834,942 A 11/1998 De Angelis
6,653,943 B2 11/2003 Lamb et al.
(Continued)

FOREIGN PATENT DOCUMENTS

WO 2014140424 A1 9/2014
WO 2017160581 A1 9/2017

OTHER PUBLICATIONS

US 9,784,337 B2, 10/2017, Thomas et al. (withdrawn)
(Continued)

*Primary Examiner* — Nasima Monsur
(74) *Attorney, Agent, or Firm* — CANTOR COLBURN LLP

(57) ABSTRACT

A belt for an elevator system includes a plurality of tension members arranged along a belt width and extending longitudinally along a length of the belt, each tension member including a plurality of fibers. A metallized coating layer is applied to at least a portion of an outer surface of at least one tension member of the plurality of tension members. The metallized coating has a coating electrical conductivity greater than a tension member electrical conductivity of the at least one tension member. A jacket material at least partially encapsulates the plurality of tension members and the metallized coating layer.

13 Claims, 3 Drawing Sheets

Related U.S. Application Data

(60) Provisional application No. 62/595,158, filed on Dec. 6, 2017.

(51) Int. Cl.
    *G01R 31/08*    (2020.01)
    *D07B 1/22*    (2006.01)

(56) References Cited

U.S. PATENT DOCUMENTS

| | | | | |
|---|---|---|---|---|
| 8,192,316 | B2 * | 6/2012 | Marc | F16G 1/28 |
| | | | | 442/229 |
| 8,686,747 | B2 | 4/2014 | Berner et al. | |
| 8,807,286 | B2 | 8/2014 | Puranen et al. | |
| 9,327,941 | B2 | 5/2016 | Dold | |
| 9,423,369 | B2 | 8/2016 | Fargo et al. | |
| 9,731,939 | B2 | 8/2017 | Sun et al. | |
| 9,796,561 | B2 | 10/2017 | Guilani et al. | |
| 2003/0062225 | A1 * | 4/2003 | Stucky | D07B 1/145 |
| | | | | 187/393 |
| 2003/0121729 | A1 | 7/2003 | Heinz et al. | |
| 2004/0131834 | A1 * | 7/2004 | Hiel | H02G 7/056 |
| | | | | 438/375 |
| 2010/0140022 | A1 * | 6/2010 | Ach | F16G 5/06 |
| | | | | 187/254 |
| 2011/0284331 | A1 | 11/2011 | Stucky et al. | |
| 2014/0163664 | A1 | 6/2014 | Goldsmith | |
| 2015/0017436 | A1 * | 1/2015 | Krishnan | C23C 22/03 |
| | | | | 428/394 |
| 2015/0063415 | A1 * | 3/2015 | Garfinkel | G01N 27/61 |
| | | | | 324/693 |
| 2015/0285334 | A1 * | 10/2015 | Thomas | F16G 5/20 |
| | | | | 474/90 |
| 2015/0362450 | A1 * | 12/2015 | Lehtinen | G01N 27/20 |
| | | | | 187/391 |
| 2015/0375963 | A1 | 12/2015 | Sun et al. | |
| 2016/0016757 | A1 | 1/2016 | Honkanen et al. | |
| 2017/0057788 | A1 * | 3/2017 | Helenius | B66B 7/062 |
| 2017/0101293 | A1 * | 4/2017 | Eastman | D03D 15/43 |
| 2017/0283219 | A1 | 10/2017 | Ding et al. | |
| 2017/0283220 | A1 * | 10/2017 | Ding | D07B 5/006 |
| 2018/0282125 | A1 * | 10/2018 | Zhao | B66B 7/062 |
| 2019/0168999 | A1 | 6/2019 | Guilani | |

OTHER PUBLICATIONS

Ouellette Sylvain; Device for Analysis of Synthetic Rope or Cable, and Method of Use; the Minister of Natural Resources Canada; WO2015149165A1; (Year: 2015).*

Eastman Scott Alan et al.; Woven Elevator Belt With Coating; WO2015134023A1; Publication Date: Sep. 11, 2015; Otis Elevator Co [US]; (Year: 2015).*

Chinese Office Action for Chinese Application No. 201811479676. 8; Issued Apr. 21, 2020; 9 pages.

European Search Report Issued In EP Application No. 18210825.8, Mail Date Apr. 15, 2019, 10 Pages.

* cited by examiner

WEAR DETECTION FOR ELEVATOR SYSTEM BELT

CROSS-REFERENCE TO RELATED APPLICATIONS

This application is a division of U.S. application Ser. No. 16/211,620, filed Dec. 6, 2018, and claims the benefit of U.S. Provisional Application No. 62/595,158, filed Dec. 6, 2017, the disclosures of which are incorporated herein by reference in their entirety.

BACKGROUND

The subject matter disclosed herein relates to elevator systems. More particularly, the present disclosure relates wear detection of elevator system belts, such as those having non-metallic load bearing members.

Elevator systems are useful for carrying passengers, cargo, or both, between various levels in a building. Some elevators are traction based and utilize load bearing members such as belts for supporting the elevator car and achieving the desired movement and positioning of the elevator car.

Where a belt is used as a load bearing member, a plurality of tension members, or cords, are embedded in a common jacket. The jacket retains the cords in desired positions and provide a frictional load path. In an exemplary traction elevator system, a machine drives a traction sheave with which the belts interact to drive the elevator car along a hoistway. Belts typically utilize tension members formed from steel elements, but alternatively may utilize tension members formed from synthetic fibers or other non-metallic materials, such as carbon fiber composites.

In a carbon fiber composite tension member, the members have good strength to weight characteristics, but typically have reduced high temperature performance compared to tension members formed from steel wires. It is desired to monitor the belt for wear and/or damage during its operating life.

BRIEF DESCRIPTION

In one embodiment, a belt for an elevator system includes a plurality of tension members arranged along a belt width and extending longitudinally along a length of the belt, each tension member including a plurality of fibers. A metallized coating layer is applied to at least a portion of an outer surface of at least one tension member of the plurality of tension members. The metallized coating has a coating electrical conductivity greater than a tension member electrical conductivity of the at least one tension member. A jacket material at least partially encapsulates the plurality of tension members and the metallized coating layer.

Additionally or alternatively, in this or other embodiments the at least one tension member is formed from the plurality of fibers suspended in a thermoset matrix material.

Additionally or alternatively, in this or other embodiments the plurality of fibers are formed from one or more of, glass, liquid crystal polymer, basalt, polyester, nylon or aramid materials.

Additionally or alternatively, in this or other embodiments the plurality of fibers are formed from carbon fibers.

Additionally or alternatively, in this or other embodiments the tension member electrical conductivity is in the range of $10^{-21}$ to $10^5$ siemens per meter.

Additionally or alternatively, in this or other embodiments the coating layer is formed from one or more of electrically conductive materials with conductivity greater than $10^6$ siemens per meter.

Additionally or alternatively, in this or other embodiments the coating layer is formed from one or more paramagnetic materials.

Additionally or alternatively, in this or other embodiments the coating layer completely covers an outer perimetrical surface of the at least one tension member.

In another embodiment, a method of health monitoring of a belt of an elevator system includes connecting a health monitoring unit to a belt of an elevator system. The belt includes a plurality of tension members arranged along a belt width and extending longitudinally along a length of the belt, each tension member including a plurality of fibers. A metallized coating layer is applied to at least a portion of an outer surface of at least one tension member of the plurality of tension members. The metallized coating has a coating electrical conductivity greater than a tension member electrical conductivity of the at least one tension member. A jacket material at least partially encapsulates the plurality of tension members and the metallized coating layer. A voltage is applied across the metallized coating layer of the at least one tension member via the health monitoring unit, and one or more electrical properties are evaluated at the health monitoring unit. The one or more electrical properties are indicative of a health condition of the belt.

Additionally or alternatively, in this or other embodiments the one or more electrical properties are one or more of electrical resistance or continuity.

Additionally or alternatively, in this or other embodiments an open circuit detected by the health monitoring unit is indicative of a damaged or broken tension member.

Additionally or alternatively, in this or other embodiments magnetic induction is utilized to measure a thickness of the jacket material, wherein the metallized coating layer comprises one or more paramagnetic materials.

Additionally or alternatively, in this or other embodiments a baseline electrical resistance is measured across the metallized coating layer via the health monitoring unit, and a subsequent electrical resistance is measured across the metallized coating layer after a predetermined time via the health monitoring unit. A change in electrical resistance from the baseline electrical resistance to the subsequent electrical resistance is indicative of wear of or damage to the jacket material.

Additionally or alternatively, in this or other embodiments the metallized coating layer is applied to the tension member via one of a cold spray or an electrodeposition process.

In yet another embodiment, an elevator system includes a hoistway, an elevator car located in the hoistway, and a belt operably connected to the elevator car to suspend and/or drive the elevator car along the hoistway. The belt includes a plurality of tension members arranged along a belt width and extending longitudinally along a length of the belt, each tension member including a plurality of fibers. A metallized coating layer is applied to at least a portion of an outer surface of at least one tension member of the plurality of tension members. The metallized coating has a coating electrical conductivity greater than a tension member electrical conductivity of the at least one tension member. A jacket material at least partially encapsulates the plurality of tension members and the metallized coating layer.

Additionally or alternatively, in this or other embodiments at the least one tension member is formed from the plurality of fibers suspended in a thermoset matrix material.

Additionally or alternatively, in this or other embodiments the plurality of fibers are formed from one or more of glass, liquid crystal polymer, basalt, polyester, nylon or aramid materials.

Additionally or alternatively, in this or other embodiments the plurality of fibers are formed from carbon fibers.

Additionally or alternatively, in this or other embodiments the tension member electrical conductivity is in the range of $10^{-21}$ to $10^5$ siemens per meter.

Additionally or alternatively, in this or other embodiments the coating layer is formed from one or more of electrically conductive materials with conductivity greater than $10^6$ siemens per meter.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

DETAILED DESCRIPTION

A detailed description of one or more embodiments of the disclosed apparatus and method are presented herein by way of exemplification and not limitation with reference to the Figures.

Figure 1:
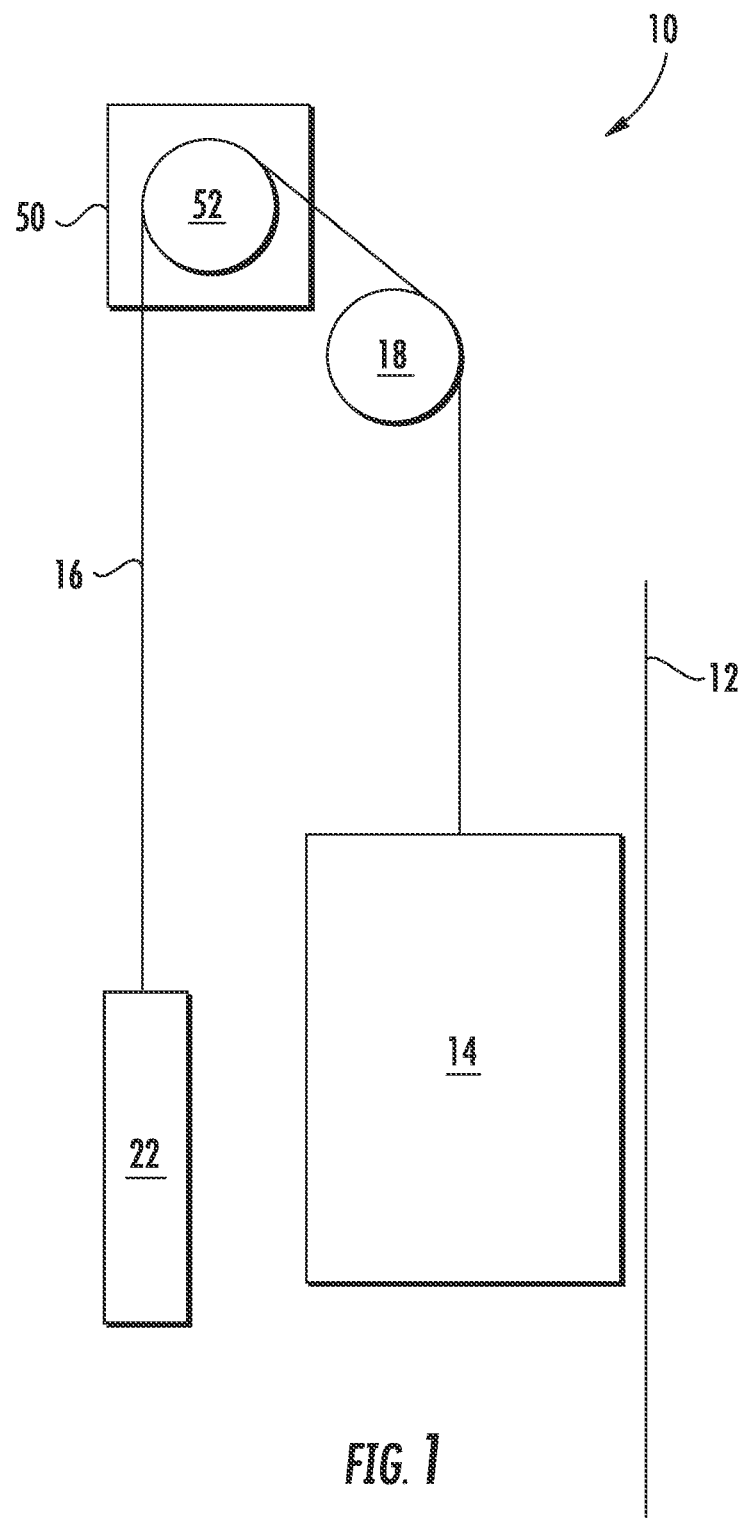
FIG. 1 is a schematic view of an exemplary elevator system.

Shown in FIG. 1, is a schematic view of an exemplary traction elevator system 10. Features of the elevator system 10 that are not required for an understanding of the present invention (such as the guide rails, safeties, etc.) are not discussed herein. The elevator system 10 includes an elevator car 12 operatively suspended or supported in a hoistway 14 with one or more belts 16. The one or more belts 16 interact with one or more sheaves 18 to be routed around various components of the elevator system 10. The one or more belts 16 could also be connected to a counterweight 22, which is used to help balance the elevator system 10 and reduce the difference in belt tension on both sides of the traction sheave during operation.

The sheaves 18 each have a diameter, which may be the same or different than the diameters of the other sheaves 18 in the elevator system 10. At least one of the sheaves could be a traction sheave 52. The traction sheave 52 is driven by a machine 50. Movement of drive sheave by the machine 50 drives, moves and/or propels (through traction) the one or more belts 16 that are routed around the traction sheave 52. At least one of the sheaves 18 could be a diverter, deflector or idler sheave. Diverter, deflector or idler sheaves are not driven by a machine 50, but help guide the one or more belts 16 around the various components of the elevator system 10.

In some embodiments, the elevator system 10 could use two or more belts 16 for suspending and/or driving the elevator car 12. In addition, the elevator system 10 could have various configurations such that either both sides of the one or more belts 16 engage the one or more sheaves 18 or only one side of the one or more belts 16 engages the one or more sheaves 18. The embodiment of FIG. 1 shows a 1:1 roping arrangement in which the one or more belts 16 terminate at the car 12 and counterweight 22, while other embodiments may utilize other roping arrangements.

The belts 16 are constructed to have sufficient flexibility when passing over the one or more sheaves 18 to provide low bending stresses, meet belt life requirements and have smooth operation, while being sufficiently strong to be capable of meeting strength requirements for suspending and/or driving the elevator car 12.

Figure 2:
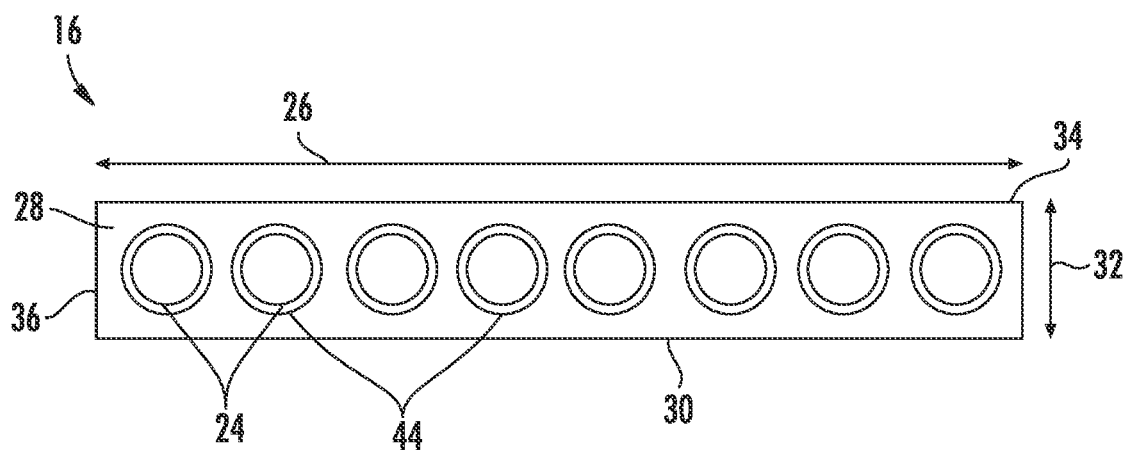
FIG. 2 is a cross-sectional view of an embodiment of a belt for an elevator system.

FIG. 2 provides a cross-sectional schematic of an exemplary belt 16 construction or design. The belt 16 includes a plurality of tension members 24 extending longitudinally along the belt 16 and arranged across a belt width 26. The tension members 24 are at least partially enclosed in a jacket material 28 to restrain movement of the tension members 24 in the belt 16 and to protect the tension members 24. The jacket material 28 defines a traction side 30 configured to interact with a corresponding surface of the traction sheave 52. Exemplary materials for the jacket material 28 include the elastomers of thermoplastic and thermosetting polyurethanes, polyamide, thermoplastic polyester elastomers, and rubber, for example. Other materials may be used to form the jacket material 28 if they are adequate to meet the required functions of the belt 16. For example, a primary function of the jacket material 28 is to provide a sufficient coefficient of friction between the belt 16 and the traction sheave 52 to produce a desired amount of traction therebetween. The jacket material 28 should also transmit the traction loads to the tension members 24. In addition, the jacket material 28 should be wear resistant and protect the tension members 24 from impact damage, exposure to environmental factors, such as chemicals, for example.

The belt 16 has a belt width 26 and a belt thickness 32, with an aspect ratio of belt width 26 to belt thickness 32 greater than one. The belt 16 further includes a back side 34 opposite the traction side 30 and belt edges 36 extending between the traction side 30 and the back side 34. While eight tension members 24 are illustrated in the embodiment of FIG. 2, other embodiments may include other numbers of tension members 24, for example, 4, 6, 10 or 12 tension members 24. Further, while the tension members 24 of the embodiment of FIG. 2 are substantially identical, in other embodiments, the tension members 24 may differ from one another. While the tension members 24 in the embodiment of FIG. 2 are circular in cross-section, it is to be appreciated that other cross-sectional shapes, such as rectangular, oval, or other shapes, may be utilized in other embodiments.

Figure 3:
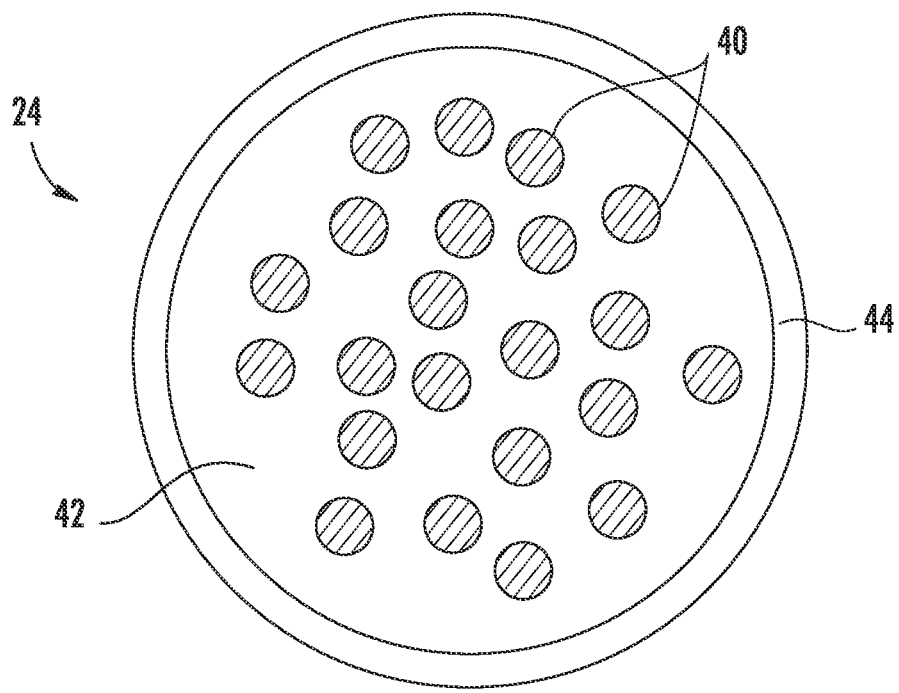
FIG. 3 illustrates an embodiment of a tension element for a belt of an elevator system.

Referring now to FIG. 3, the tension members 24 include a plurality of fibers 40 bonded to a polymer matrix 42 to form the tension members 24. The fibers 40 are continuous or discontinuous or combination of continuous and discontinuous over the belt 16 length and, oriented generally such that a fiber 40 length is directed along the belt 16 length. The fibers 40 may be formed of one or more of a number of materials, such as carbon, glass, liquid crystal polymer, basalt, polyester, nylon, aramid or other polyimide materials. Further, the fibers 40 may be organized into a grouping, such as a spun yarn. The matrix 42 may be formed of, for example a thermoset or thermoplastic material. The tension member 24 is further configured to have a fiber 40 density of 30% to 70% fibers 40 per unit of volume. In some embodiments, the fibers 40 may vary in size, length or circumference and may further be intentionally varied to provide a selected maximum fiber 40 density. In some embodiments, the tension members 24 may be formed as thin layers, in some embodiments by a pultrusion process. In a standard pultrusion process, the load carrying fibers 40 are impregnated with the matrix material 42 and are pulled through a heated die and additional curing heaters where the matrix material 42 undergoes cross linking. In some embodiments, a dry fiber construction is utilized in forming the tension member 24, with the dry fiber construction characterized by the absence of the matrix material.

Figure 4:
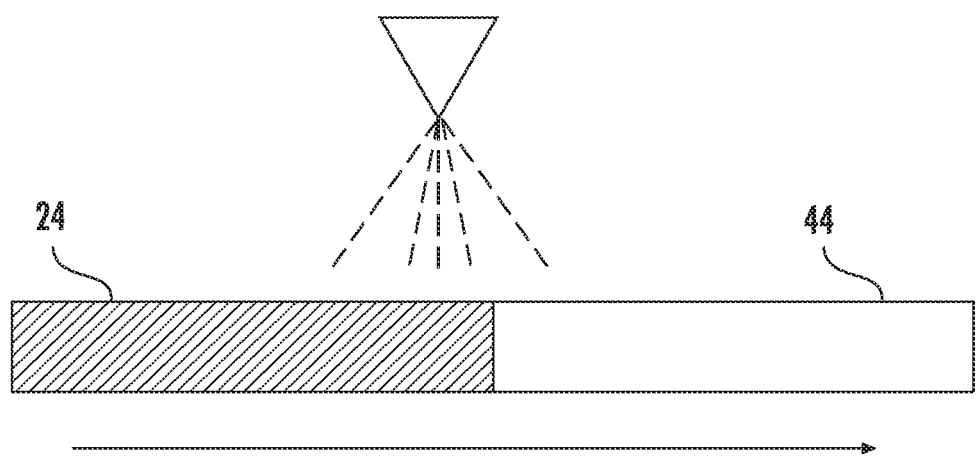
FIG. 4 schematically illustrates application of an embodiment of a coating layer to a tension element.

The tension members 24 based upon glass, liquid crystal polymer, basalt, polyester, nylon, aramid or other polymeric fibers have low electrical conductivity, for example, in the range of $10^{-6}$ to $10^{-21}$ siemens per meter. Tension members 24 based upon carbon fibers have higher electrical conductivity, for example $10^2$ to $10^5$ siemens per meter. A coating layer 44 is applied to the tension members 24 as shown in FIG. 2. The coating layer 44 is of a material having a higher electrical conductivity than the tension member 24, for example electrical conductivity greater than $10^6$ siemens per meter and may be a metallized coating including, but not limited to, copper, iron, nickel or other metallic materials. Referring to FIG. 4, the coating layer 44 is applied to the tension member 24 via, for example, a cold spray operation, or alternatively by another process such as electrodeposition. The composition of the coating layer 44 also includes those based on graphenes and similar nanostructured materials dispersed in a base polymer provided that the electrical conductivity of the coating layer is greater than $10^6$ siemens per meter. In some embodiments, the coating layer 44 is applied over an entire external surface of the tension member 24, while in other embodiments the coating layer 44 is applied only to a selected surface or surfaces of the tension member 24. Referring again to FIG. 2, in the embodiment illustrated the coating layer 44 is applied to each of the tension members 24. In other embodiments, the coating layer 44 may be applied to only selected tension members 24 of the belt 16, for example, tension members 24 closest to the belt edges 36, and/or tension members 24 nearest a lateral center of the belt 16.

Figure 5:
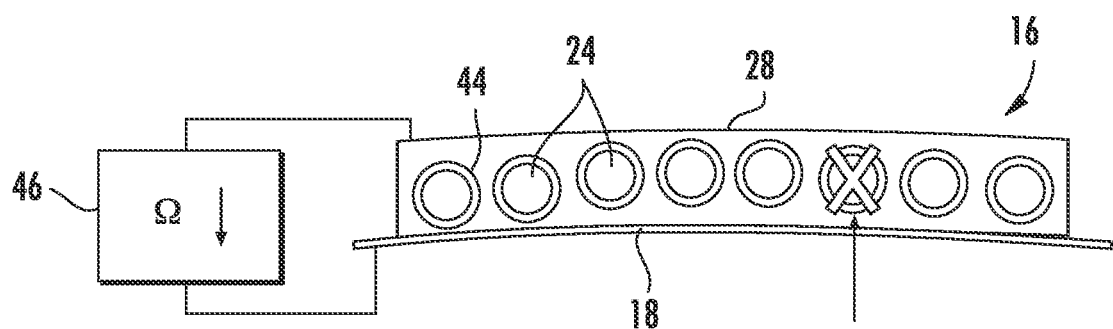
FIG. 5 schematically illustrates health monitoring of an embodiment of an elevator system belt.

Referring now to FIG. 5, utilization of the coating layer 44 allows for health monitoring of the belt 16, in particular monitoring of the tension members 24 for breakage or damage, and wear of the jacket material 28. The belt 16, in particular the coating layer 44, is connected to a health monitoring unit 46. A voltage is applied across the coating layer 44, and the result is indicative of a condition of the belt 16 and/or the tension member 24. For example, a broken or damaged tension member 24 is detected as an open circuit. Further, wear of the jacket material 28 may be detected by the health monitoring unit 46. When the jacket material 28 wears or erodes, the coating layer 44 at one or more tension members 24 contacts the sheave 18. In doing so, when the voltage is applied to the coating layer 44 via the health monitoring unit 46 a resistance or continuity measured at the health monitoring unit 46 changes relative to the resistance or continuity measured when the coating layer 44 is not contacting the sheave 18. In such applications, a baseline resistance or continuity may be obtained when the coating layer 44 is not contacting the sheave 18, for example, when the belt 16 is new or entering service. Subsequent measured resistances or continuity may be compared to the baseline measurement, and when a change is observed, such a change is indicative of the coating layer 44 contacting the sheave 18, and thus evidence of a worn or damaged jacket material 28.

Furthermore, if the coating layer 44 comprises a paramagnetic material such as but not limited to iron and/or nickel, the thickness of the jacket material 28 can be directly measured using magnetic induction methods. Such a technique has been to detect partial wear of jacket material 28. The integrity of the tension members 24 when coated with a paramagnetic material can be assessed using magnetic flux leakage techniques described in prior art related to steel reinforced belt applications.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate in spirit and/or scope. Additionally, while various embodiments have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A belt for an elevator system, comprising:
a plurality of non-metallic tension members arranged along a belt width and extending longitudinally along a length of the belt, each tension member including a plurality of fibers;
a metallized coating layer applied directly to a first portion of an outer surface of at least one tension member of the plurality of tension members, a second portion of the outer surface free from the metallized coating, the metallized coating having a coating electrical conductivity greater than a tension member electrical conductivity of the at least one tension member; and
a jacket material at least partially encapsulating the plurality of tension members and the metallized coating layer;
wherein the metallized coating includes graphene-based materials;
wherein a tension member of the plurality of tension members has a fiber density of the plurality of fibers in the range of 30% to 70% fibers per unit of volume of the tension member; and
wherein the at least one tension member is formed from the plurality of fibers suspended in a thermoset matrix material;
wherein the metallized coating layer is applied to a first tension member of the plurality of tension members, and the metallized coating layer is absent from a second tension member of the plurality of tension members.

2. The belt of claim 1, wherein the plurality of fibers are formed from one or more of, glass, liquid crystal polymer, basalt, polyester, nylon or aramid materials.

3. The belt of claim 1, wherein the plurality of fibers are formed from carbon fibers.

4. The belt of claim 1, wherein the tension member electrical conductivity is in the range of $10^{21}$ to $10^5$ siemens per meter.

5. The belt of claim 1, wherein the coating layer is formed from one or more of electrically conductive materials with conductivity greater than $10^6$ siemens per meter.

6. The belt of claim 1, wherein the coating layer is formed from one or more paramagnetic materials.

7. The belt of claim 1, wherein the coating layer completely covers an outer perimetrical surface of the at least one tension member.

8. An elevator system comprising:
a hoistway;
an elevator car disposed in the hoistway; and
a belt operably connected to the elevator car to suspend and/or drive the elevator car along the hoistway, the belt including:
- a plurality of non-metallic tension members arranged along a belt width and extending longitudinally along a length of the belt, each tension member including a plurality of fibers;
- a metallized coating layer applied directly to a first portion of an outer surface of at least one tension member of the plurality of tension members, a second portion of the outer surface free from the metallized coating, the metallized coating having a coating electrical conductivity greater than a tension member electrical conductivity of the at least one tension member; and
- a jacket material at least partially encapsulating the plurality of tension members and the metallized coating layer;

a traction sheave disposed in the hoistway over which the belt is routed to urge movement of the elevator car along the hoistway;
a health monitoring unit operably connected to the belt at the metallized coating layer, the health monitoring unit configured to:
- apply a voltage across the metallized coating layer;
- measure a baseline electrical resistance across the metallized coating layer; and
- measure a subsequent electrical resistance across the metallized coating layer after a predetermined time;

wherein a change in electrical resistance from the baseline electrical resistance to the subsequent electrical resistance is indicative of wear of or damage to the jacket material, the change in electrical resistance indicative of contact of the metallized coating layer with the traction sheave;

wherein a tension member of the plurality of tension members has a fiber density of the plurality of fibers in the range of 30% to 70% fibers per unit of volume of the tension member; and wherein the at least one tension member is formed from the plurality of fibers suspended in a thermoset matrix material;

wherein the metallized coating layer is applied to a first tension member of the plurality of tension members, and the metallized coating layer is absent from a second tension member of the plurality of tension members.

9. The elevator system of claim 8, wherein the plurality of fibers are formed from one or more of glass, liquid crystal polymer, basalt, polyester, nylon or aramid materials.

10. The elevator system of claim 8, wherein the plurality of fibers are formed from carbon fibers.

11. The elevator system of claim 8, wherein the tension member electrical conductivity is in the range of $10^{21}$ to $10^5$ siemens per meter.

12. The elevator system of claim 8, wherein the coating layer is formed from one or more of electrically conductive materials with conductivity greater than $10^6$ siemens per meter.

13. The elevator system of claim 8, wherein the metallized coating includes a graphene-based material.

* * * * *